US011908719B2

(12) United States Patent
Cheng et al.

(10) Patent No.: US 11,908,719 B2
(45) Date of Patent: *Feb. 20, 2024

(54) ROUNDED VERTICAL WAFER VESSEL RODS

(71) Applicant: Taiwan Semiconductor Manufacturing Co., Ltd., Hsin-Chu (TW)

(72) Inventors: Ching-Wen Cheng, Zhubei (TW); Xin-Kai Huang, Hsinchu (TW); Kuei-Hsiung Cho, Xinpu Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,597

(22) Filed: Aug. 8, 2022

(65) Prior Publication Data

US 2022/0384224 A1    Dec. 1, 2022

Related U.S. Application Data

(63) Continuation of application No. 16/746,049, filed on Jan. 17, 2020, now Pat. No. 11,450,542.

(51) Int. Cl.
*H01L 21/673* (2006.01)
*C23C 16/458* (2006.01)
*H01L 21/02* (2006.01)
*C23C 16/46* (2006.01)

(52) U.S. Cl.
CPC .... *H01L 21/67309* (2013.01); *C23C 16/4583* (2013.01); *C23C 16/46* (2013.01); *H01L 21/0217* (2013.01); *H01L 21/02271* (2013.01)

(58) Field of Classification Search
CPC ........... H01L 21/0217; H01L 21/02271; H01L 21/046; H01L 21/265; H01L 21/268; H01L 21/67309; H01L 29/32; H01L 29/36; C23C 16/4583; C23C 16/46; C30B 25/12; B23K 26/082
See application file for complete search history.

(56) References Cited

U.S. PATENT DOCUMENTS

| 6,407,368 | B1 | 6/2002 | Hsu et al. |
| 6,435,865 | B1 | 8/2002 | Tseng et al. |
| 9,105,591 | B2 | 8/2015 | Wei et al. |
| 2002/0170487 | A1* | 11/2002 | Zehavi ................... C30B 33/02 117/84 |
| 2008/0185308 | A1* | 8/2008 | Herzog ............. H01L 21/67309 206/445 |
| 2013/0284683 | A1* | 10/2013 | Jdira ................. H01L 21/67309 211/41.18 |

* cited by examiner

*Primary Examiner* — Brook Kebede
(74) *Attorney, Agent, or Firm* — Duane Morris LLP

(57) ABSTRACT

In an embodiment, a system includes: a base; and a rod set comprising multiple rods connected to the base, wherein each rod of the rod set comprises multiple fingers disposed in a vertically-stacked relationship to each other and separated respectively from each other by respective slots, wherein each slot is configured to receive a bevel of a wafer, and wherein each of the multiple fingers comprises a rounded end at a furthest extension.

20 Claims, 9 Drawing Sheets

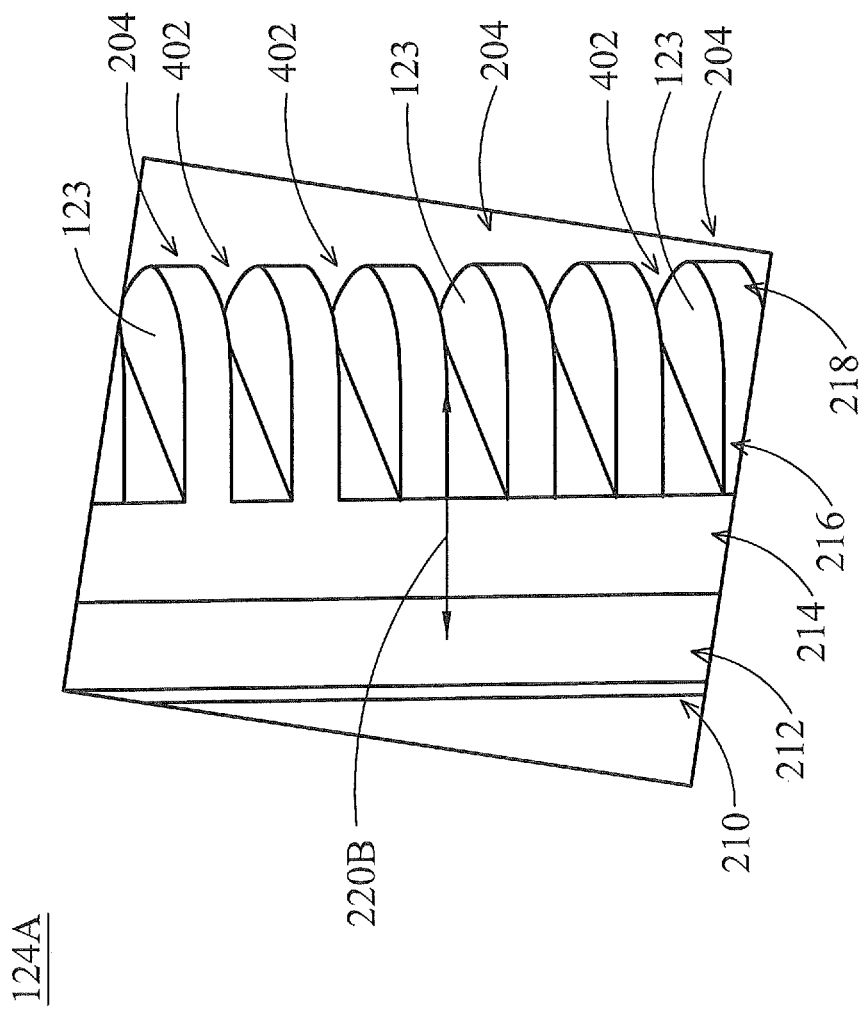

ROUNDED VERTICAL WAFER VESSEL RODS

CROSS-REFERENCE TO RELATED APPLICATIONS

This application is a continuation of U.S. patent application Ser. No. 16/746,049, filed Jan. 17, 2020, each of which is incorporated by reference herein in their entireties.

BACKGROUND

With advances of electronic products, semiconductor technology has been widely applied in manufacturing memories, central processing units (CPUs), liquid crystal displays (LCDs), light emission diodes (LEDs), laser diodes and other devices or chip sets. In order to achieve high-integration and high-speed requirements, dimensions of semiconductor integrated circuits have been reduced and various materials and techniques have been proposed to achieve these requirements and overcome obstacles during manufacturing. Controlling the conditions of processing wafers within chambers is an important part of semiconductor fabrication technology.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 4A is a detailed perspective view of the rod, in accordance with some embodiments.

DETAILED DESCRIPTION OF EXEMPLARY EMBODIMENTS

Figure 1:
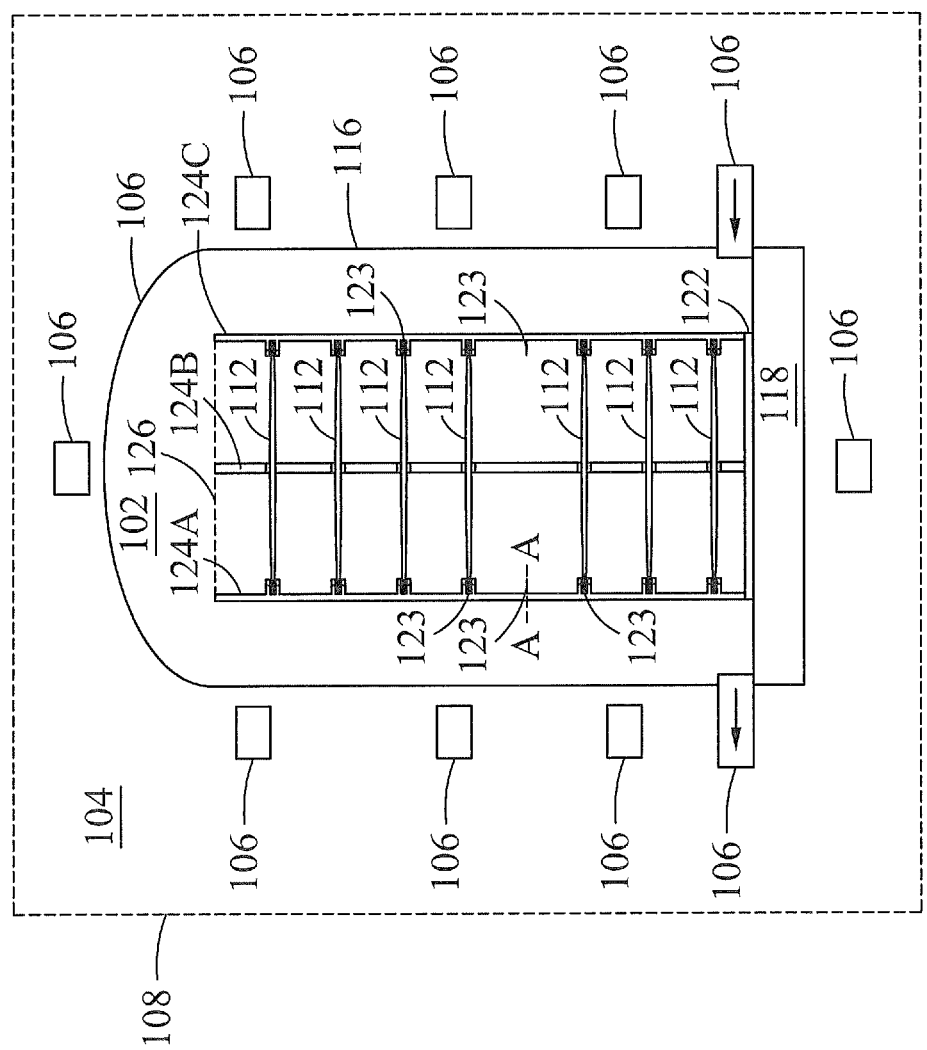
FIG. 1 is a conceptual illustration of a vertical thermal reaction chamber in which wafers held by rounded vertical wafer vessel rods may be processed, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods in accordance with various embodiments are directed to rounded vertical wafer vessel rods. In various embodiments, a vertical wafer vessel may include a base that physically connects a rod set of multiple rods. Each rod of the rod set may include multiple fingers disposed in a vertically-stacked relationship to each other and separated respectively from each other by respective slots. Each of the slots may be configured to receive a bevel of a wafer such that the vertical wafer vessel may be configured to secure multiple vessels in a vertically-stacked relationship. Also, each of the multiple fingers may include a rounded end at a furthest extension (e.g., extension from the rest of the rod).

In various embodiments, each rod may include a rear rod portion that is farthest from the wafers that the vertical wafer vessel is configured to hold, a middle rod portion adjacent the rear rod portion, an oblique rod portion adjacent to the middle rod portion, an oblique finger portion, and an end finger portion that is closest to the wafers that the vertical wafer vessel is configured to hold. Accordingly, the end finger portion may be configured to contact the wafer. In various embodiments, the oblique finger portion may extend from the rounded end along a straight line. Also, the oblique rod portion may extend from the oblique finger portion along that same straight line. In various embodiments, the oblique finger portion may be bound within two straight lines (e.g., two lines) that are from about 80 degrees to about 40 degrees apart from each other, such as by being about 53 degrees apart from each other. In certain embodiments, the base may comprise an opening and be shaped in an annular fashion (e.g., with a central opening). Also, in various embodiments, the rod set may include three rods. Although certain embodiments may contemplate a rod set as including three rods, any number of rods may be included in a rod set as desired for different applications in various embodiments. For example, a rod set of a vertical wafer vessel may include two rods in certain embodiments, four rods in other embodiments, or five rods in yet further embodiments.

In various embodiments, the rear rod portion, the middle rod portion, the oblique rod portion, the oblique finger portion, and the end finger portion may extend along a central axis. The end finger portion may be shorter along the central axis than the oblique finger portion. Also, the rear rod portion may be shorter along the central axis than the oblique finger portion.

In specific embodiments, the vertical wafer vessels may be configured to be disposed and processed within a vertical thermal reaction chamber. The vertical thermal reaction chamber may be utilized in the context of semiconductor processing or fabrication steps such as oxidation, diffusion, doping, annealing, and chemical vapor deposition (CVD). These processes are typically performed at elevated temperatures within heated controlled environments. CVD is a chemical vapor deposition process used to produce or deposit thin films of material on the wafer including without limitation metals, silicon dioxide, tungsten, silicon nitride, silicon oxynitride, and various dielectrics. The CVD process entails placing a wafer or plurality of wafers in a heated reaction chamber and introducing one or more reactant gases into the chamber. The gases contain various chemical precursors (e.g. $SiH_2Cl_2$ and $NH_3$ or silane and $NH_3$ to form a silicon nitride film) that react at the heated wafer surface to form a thin film of the desired semiconductor material and thickness thereon. The uniformity of the film deposited on the wafer by CVD is affected and controlled by regulating and attempting to optimize CVD process parameters such as temperature of the wafer, reaction chamber pressure, flow path and rate of reactant gases, and deposition time or duration.

Accordingly, a vertical thermal reaction chamber may be a type of heated or thermal reaction chamber used in CVD processes. These vertical thermal reaction chambers are capable of holding a plurality of vertically-stacked semiconductor wafers which undergo CVD batch processing simultaneously. The vertical thermal reaction chambers may be loaded with multiple wafers that in some embodiments are held in a vertically-stackable rack referred to as a vertical wafer vessel, a wafer ladder or boat. The vertical wafer vessel may include a frame (e.g., rods and a base) having multiple horizontal slots which each may hold an individual wafer in spaced-apart, stacked vertical relationship to the other wafers. In certain embodiments, the vertical wafer vessels may hold from approximately 50 to approximately 125 wafers. Vertical space is provided between the wafers to allow the CVD reactant gases to circulate therethrough for foliating the desired material film deposits on top of the wafers. In certain embodiments, the vertical thermal reaction chambers are cylindrical in shape (also referred to as reaction tubes) and generally have a closed top and open bottom portal to allow for insertion of the vertical wafer vessels holding the vertical wafer stacks.

The vertical thermal reaction chambers, vertical wafer vessels, and other components that may be exposed to the heat and corrosive gases are commonly made of quartz or SiC to withstand CVD process temperatures that may range from about 200-1200 degrees centigrade (C). in some applications depending on the type of semiconductor material film to be deposited on the wafers.

The vertical wafer vessels may be disposed on an openable/closeable lid assembly which forms a bottom portal and platform for supporting the vertical wafer vessel. The lid assembly may be configured and adapted to temporarily attach to and seal the bottom portal of the reaction chamber to form a gas-tight temporary connection during CVD processing. The lid assembly may be mounted on a vertical elevator or lift which is operable to raise and lower the vertical wafer vessel into and from the reaction chamber. The reaction chamber and associated assembly may include a gas manifold with gas inlets and gas outlets for introducing and removing CVD process reactant gases from the reaction chamber. In certain embodiments, a rotator (e.g., shaft or other rotating platform) may rotating the vertical wafer vessel and wafers held therein when the vertical wafer vessel is positioned in the reaction chamber may be provided to promote uniform gas flow and heating throughout the wafer stack.

The vertical semiconductor furnace may include a heat source, which in some embodiments may include resistance type heaters, radiant type heaters, or a combination thereof. Examples of resistance type heaters include electric resistive wire coil elements or similar. Some examples of radiant type heaters include heating lamps or quartz-heating elements. The heaters may be disposed outside but proximate to the quartz reaction chamber to heat the chamber and increase its internal temperature.

FIG. 1 is a conceptual illustration of a vertical thermal reaction chamber 102 in which wafers held by rounded vertical wafer vessel rods may be processed, in accordance with some embodiments. In certain embodiments, the vertical thermal reaction chamber 102 may be part of a semiconductor furnace 104 that processes wafer sizes of 300 mm or less. As illustrated, there may be multiple heater zones 106 provided proximate the periphery (e.g., walls) of the vertical thermal reaction chamber 102. Each heater zone 106 may be defined by and includes a heater, which in some embodiments is an electric resistance type heater coil or element. For example, heater zones 106 may be provided at the sidewall of reaction chamber, one top heater zone, and one bottom heater zone. Electric or electronic heater controls may be provided to allow the temperature output from each heater to be adjusted by varying the energy input from an electrical power source.

The semiconductor furnace 104 may be a tool incorporating a CVD vertical thermal reaction chamber 102. Semiconductor furnace 104 may include an insulated housing 108 (illustrated with dotted lines) which is configured and adapted to provide a thermal enclosure around substantially all of the vertical thermal reaction chamber 102 to establish a temperature controlled environment for the vertical thermal reaction chamber 102. The CVD vertical thermal reaction chamber 102 may include an internal cavity defining a space for removably receiving a vertical wafer vessel 110 that is configured and adapted for supporting and holding a plurality of vertically-stacked wafers 112 as will be discussed in further detail below. In one embodiment, vertical thermal reaction chamber 102 may have a closed top 114, sidewall 116, and openable bottom portal 118 to allow the vertical wafer vessel 110 to be inserted and removed from the vertical thermal reaction chamber 102 for batch processing of wafers 112. In one embodiment, the vertical wafer vessel 110 comprises an open-frame structure such as a ladder or rod-type design having multiple horizontal slots for supporting the wafers 112 and allowing reactant gas to flow horizontally over the face of the wafers 112 to build the desired material film thicknesses thereon. The vertical wafer vessel 110 may be sized to hold about 50 to about 125 wafers 112 or more in some embodiments. However, any suitable number of wafers may be held by the vertical wafer vessel depending on the height of the reaction chamber 102. In some representative embodiments, typical vertical spacing of wafers 112 in vertical wafer vessel 110 may be about 6 mm to about 10 mm. In certain embodiments, the vertical wafer vessel 110 may be made of quartz, SiC, or any other suitable material for thermal operations.

The vertical thermal reaction chamber 102 may have a cylindrical shape in one embodiment and may be made of quartz or SiC. Also, the vertical thermal reaction chamber 102 may include a coating such as polysilicon or another coating material used depending on the type of process conducted in the chamber. The vertical thermal reaction chamber 102 may have any suitable height or length depending on the number of wafers to be processed in each batch. In some exemplary embodiments, the vertical thermal reaction chamber 102 may have a representative vertical height or length of 100-150 cm. However, any suitable height or length may be provided. In some embodiments, the vertical thermal reaction chamber 102 for processing 450 mm wafers may be sized to be more than 450 mm diameter and a chamber length of about 50 to 200 cm depending on the number of wafers to be processed simultaneously in the chamber.

The openable bottom portal 118 may include a lid which may be sealed to the openable bottom portal 118 of reaction chamber 102 to form a gas-tight chamber seal for processing the wafers 112. In one embodiment, the openable bottom portal 118 may be further include a flange and lid. The openable bottom portal 118 may include a support structure to provide support for vertical wafer vessel 110 which may be attached to the lid.

A reaction gas supply connection inlet 120A and outlet 120B may be furnished to allow one or more process gases to be introduced and removed from reaction chamber 102. The vertical thermal reaction chamber 102 may also interface with various gas manifold and injectors, furnace cooling to allow quick changing of wafer batches, an external insulated housing enclosing the thermal reaction chamber 102, a vertical wafer vessel elevator or lift and robotically-controlled arm for positioning, raising, and lowering the vertical wafer vessel 110 into/from thermal reaction chamber 102, may be included in certain embodiments. Furthermore, the vertical wafer vessel 110 may be located within the vertical thermal reaction chamber 102 on a motor drive mechanism (not shown) to allow the stack of wafers 112 to be rotated during the CVD process to promote uniform thickness of the layer of material deposited on the wafers. Additionally, the operation of the semiconductor furnace 104 and batch processing of wafers 112 may be controlled by a temperature controller to regulate the heat output from the furnace heating system including temperature ramp up and ramp down rates.

In various embodiments, a vertical wafer vessel 110 may include a base 122 that physically connects a rod set of multiple rods 124A, 124B, 124C. Each rod 124A, 124B, 124C of the rod set may include multiple fingers 123 disposed in a vertically-stacked relationship to each other and separated respectively from each other by respective slots. Each of the slots may be configured to receive a bevel of a wafer 112 such that the vertical wafer vessel 110 may be configured to secure multiple wafers 112 in a vertically-stacked relationship. Also, each of the multiple fingers 123 may include a rounded end at a furthest extension (e.g., extension from the rest of the rod). In various embodiments, the vertical wafer vessel 110 may optionally include a top base 126 (illustrated with dotted lines).

In various embodiments, the vertical waver vessel 110 may secure a wafer using contours or formations along the surface of the vertical wafer vessel 110, such as the fingers 123 and/or slots between the fingers 123. In certain embodiments, the fingers 123 be rounded, or greater than 90 degrees between intersecting surfaces to prevent damage to the corners of the vertical waver vessel 110 and damage to other objects (e.g., the wafer) from contact with the vertical waver vessel 110. In certain embodiments, the vertical waver vessel 110 may be configured to have all horizontal corners of the vertical waver vessel 110 be greater than 90 degrees between intersecting surfaces. In further embodiments, the vertical waver vessel 110 may have all horizontal corners (e.g., corners as viewable in a horizontal cross section of a rod) be greater than 90 degrees between intersecting surfaces. The term "intersecting surfaces" may refer to a surface of a generally uniform gradient or slope, and the term "corner" may refer to a transition between the surfaces. The cross section A-A of FIG. 1 will be referenced further below to discuss further details of the fingers 123 along the rod 124A.

Figure 2:
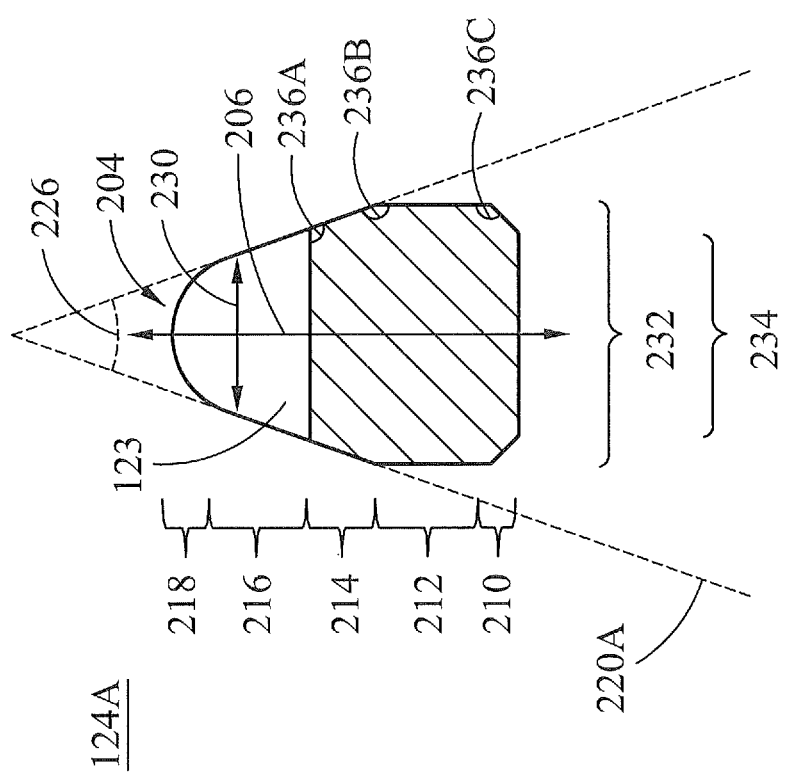
FIG. 2 illustrates a plan cross sectional view of the rod across a cross section, in accordance with some embodiments.

FIG. 2 illustrates a plan cross sectional view of the rod 124A across cross section A-A, in accordance with some embodiments. As noted above, the rod 124A may include a finger 123 with a rounded end 204 at a furthest extension (e.g., extension from the rest of the rod).

For ease of explanation, the rod 124A may be discussed with respect to a central axis 206 that bisects the rod from the tip of the rounded end 204. Along the direction of the central axis 206, the rod 124A may include a rear rod portion 210, a middle rod portion 212 adjacent the rear rod portion, an oblique rod portion 214 adjacent to the middle rod portion, an oblique finger portion 216, and an end finger portion 218. Accordingly, the end finger portion 218 (and part of the oblique finger portion 216) may be configured to contact a wafer (e.g., a bevel of a wafer). In various embodiments, the oblique finger portion 214 may extend from the rounded end finger portion 218 along a straight line 220A or 220B. Also, the oblique rod portion 214 may extend from the oblique finger portion 216 along that same straight line 220A or 220B. In various embodiments, the two straight lines may have an angular relationship 226 from about 80 degrees to about 40 degrees apart from each other, such as by being about 53 degrees apart from each other.

In various embodiments, the end finger portion 218 may be shorter along the central axis than the oblique finger portion 216. The oblique finger portion 216 may be longer than the oblique rod portion 214. The middle rod portion 212 may be longer than the oblique finger portion. Also, the rear rod portion 210 may be shorter than the middle rod portion 212.

For ease of explanation, the rod 124A may be discussed with respect to an orthogonal axis 230 orthogonal to the central axis 206. The middle rod portion 212 may have a greatest distance along the orthogonal axis 230 (e.g., middle rod portion width 232). Also, the shortest distance along the orthogonal axis 230 for the rear rod portion 210 may be the same as the longest distance along the orthogonal axis for the oblique finger portion 216 (e.g., oblique finger portion width 234).

In various embodiments, the rod 124A may be without right angles in the transitions between the rear rod portion 210 and the middle rod portion 212, between the middle rod portion 212 and the oblique rod portion 214, between the oblique rod portion 214 and the oblique finger portion 216, and between the oblique finger portion 216 and the end finger portion 218. For example, an internal angle 236A for a corner formed between the oblique rod portion 214 and the oblique finger portion may be greater than 90 degrees when measured as an angle internal to the rod. Also, an internal angle 236B for a corner formed between the middle rod portion 212 and the oblique rod portion 214 may be greater than 90 degrees when measured as an angle internal to the rod. Also, an internal angle 236C for a corner formed between the rear rod portion 210 and the middle rod portion 212 may be greater than 90 degrees when measured as an angle internal to the rod. Also, in certain embodiments, the end finger portion 218 may be curved with a circular curvature. However, in other embodiments, the end finger portion 218 may be curved with an elliptical curvature.

In various embodiments, the transitions between different portions (e.g., the rear rod portion 210, the middle rod portion 212, the oblique rod portion 214, the oblique finger portion 216, and the end finger portion 218) may be greater than 90 degrees between intersecting surfaces to prevent damage to the corners of the vertical waver vessel 110 and damage to other objects (e.g., the wafer) from contact with the vertical waver vessel 110. In certain embodiments, the vertical waver vessel 110 may be configured to have all horizontal corners of the vertical waver vessel 110 be greater than 90 degrees between intersecting surfaces (e.g., in the transitions between the different portions). In further embodiments, the vertical waver vessel 110 may have all horizontal corners (e.g., corners as viewable in a horizontal cross section of a rod, such as internal angles 236A, 236B, and 236C) be greater than 90 degrees between intersecting surfaces.

Figure 3:
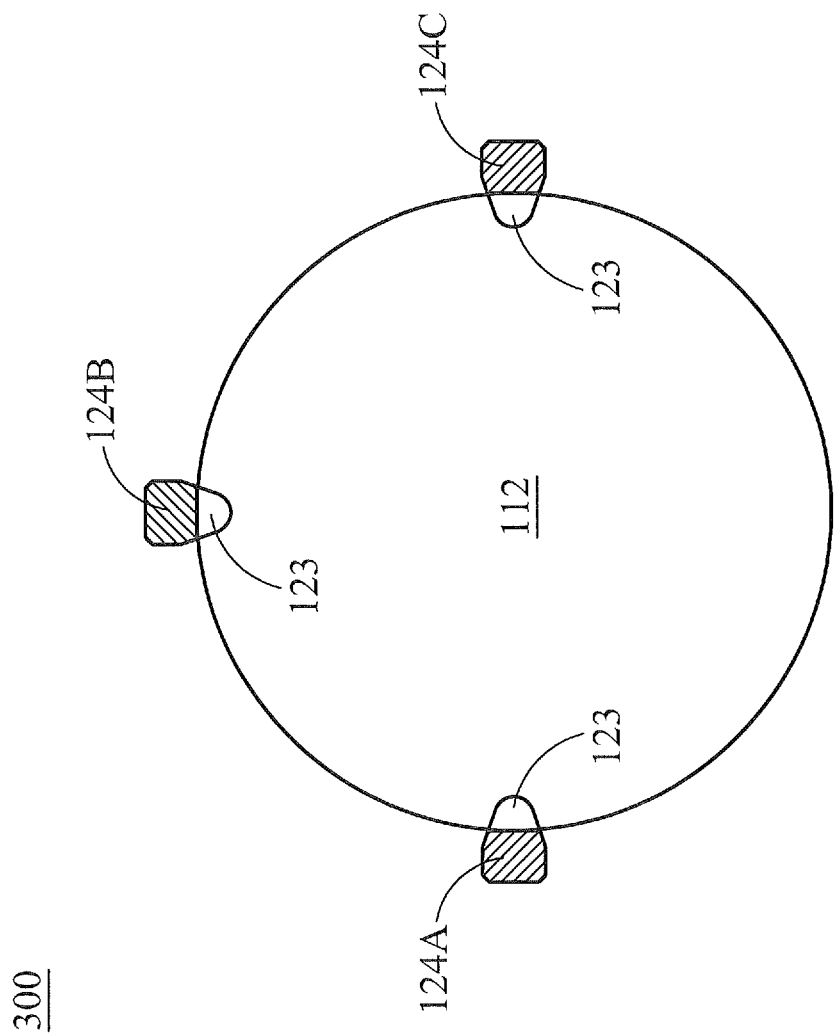
FIG. 3 is a plan view of three fingers from respective rods in contact with a wafer, in accordance with some embodiments.

FIG. 3 is a plan view 300 of three fingers from respective rods 124A, 124B, 124C in contact with a wafer 112, in accordance with some embodiments. The plan view 150 may also be along a plane of the line A-A referenced above in FIG. 1. Returning to FIG. 3, each of the rods 124A, 124B, 124C may include fingers 123. Each of the fingers 123 may be configured to contact a bevel of a wafer 112 such that a vertical wafer vessel may be configured to the wafer. Also, the fingers 123 may include a rounded end at a furthest extension (e.g., extension from the rest of the rod 124A, 124B, 124C).

FIG. 4A is a detailed perspective view of the rod 124A, in accordance with some embodiments. The rod 124A may include multiple fingers disposed in a vertically-stacked relationship to each other and separated respectively from each other by respective slots 402. Each of the slots 402 may be configured to receive a bevel of a wafer such that the vertical wafer vessel may be configured to secure multiple vessels in a vertically-stacked relationship. Also, each of the multiple fingers 123 may include a rounded end 204 at a furthest extension (e.g., extension from the rest of the rod 124).

As noted above, the rod 124A may include a rear rod portion 210, a middle rod portion 212 adjacent the rear rod portion, an oblique rod portion 214 adjacent to the middle rod portion, an oblique finger portion 216, and an end finger portion 218. Accordingly, the end finger portion 218 may be configured to contact a wafer (e.g., a bevel of a wafer). In various embodiments, the oblique finger portion 214 may extend from the rounded end finger portion 218 along the straight line 220B. Also, the oblique rod portion 214 may extend from the oblique finger portion 216 along that same straight line 220B.

Figure 4B:
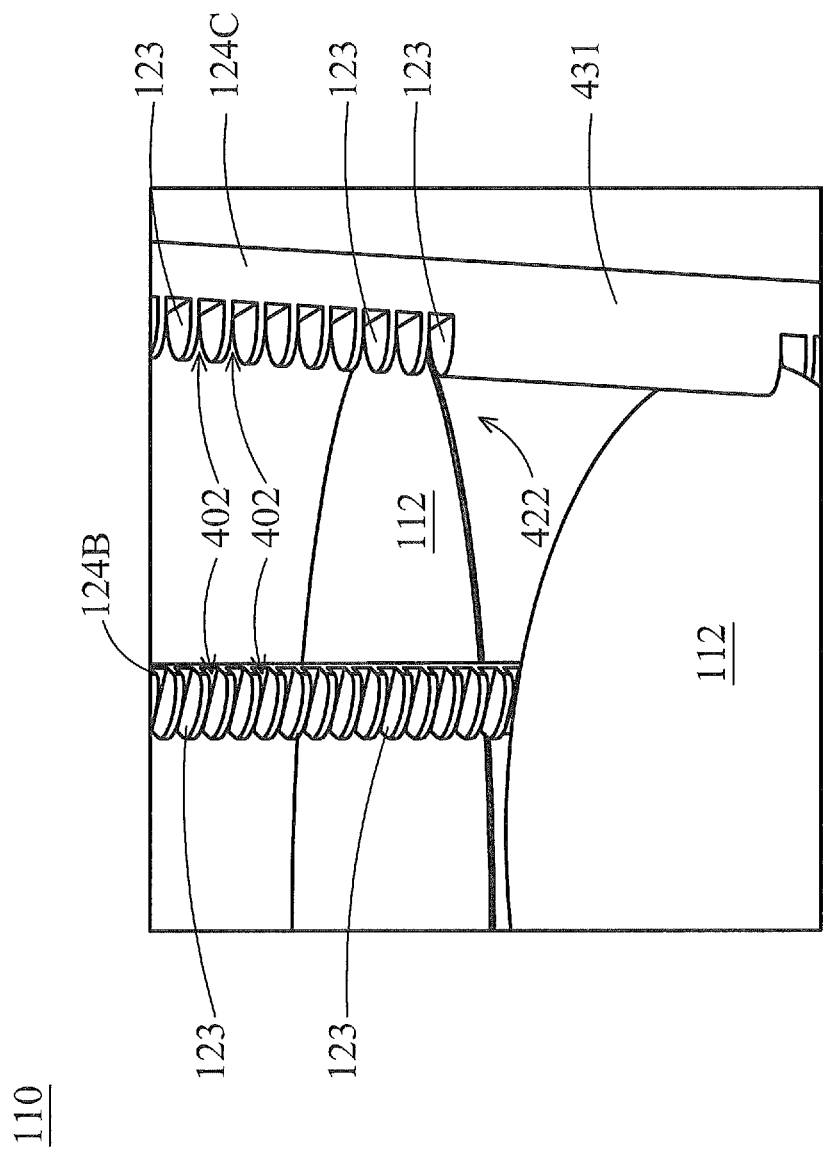
FIG. 4B is a perspective view of the rods, in accordance with some embodiments.

FIG. 4B is a perspective view of the rods 124B and 124C, in accordance with some embodiments. In various embodiments, the vertical wafer vessel 110 may include a base that physically connects the rods 124B, 124C. Each rod 124B, 124C of the rod set may include multiple fingers 123 disposed in a vertically-stacked relationship to each other and separated respectively from each other by respective slots 402. Each of the slots 402 may be configured to receive a bevel 422 of a wafer 112 such that the vertical wafer vessel 110 may be configured to secure multiple wafers 112 in a vertically-stacked relationship. Also, each of the multiple fingers 123 may include a rounded end at a furthest extension (e.g., extension from the rest of the rod).

In various embodiments, different rods 124B, 124C may have different arrangements of fingers 123. For example, the rod 124C may have fewer fingers 123 than the rod 124B. More specifically, the rod 124C may have a slotless portion 431 in which there are no slots at a same vertical orientation (e.g., height or z axis) as that of the rod 124B.

Figure 4C:
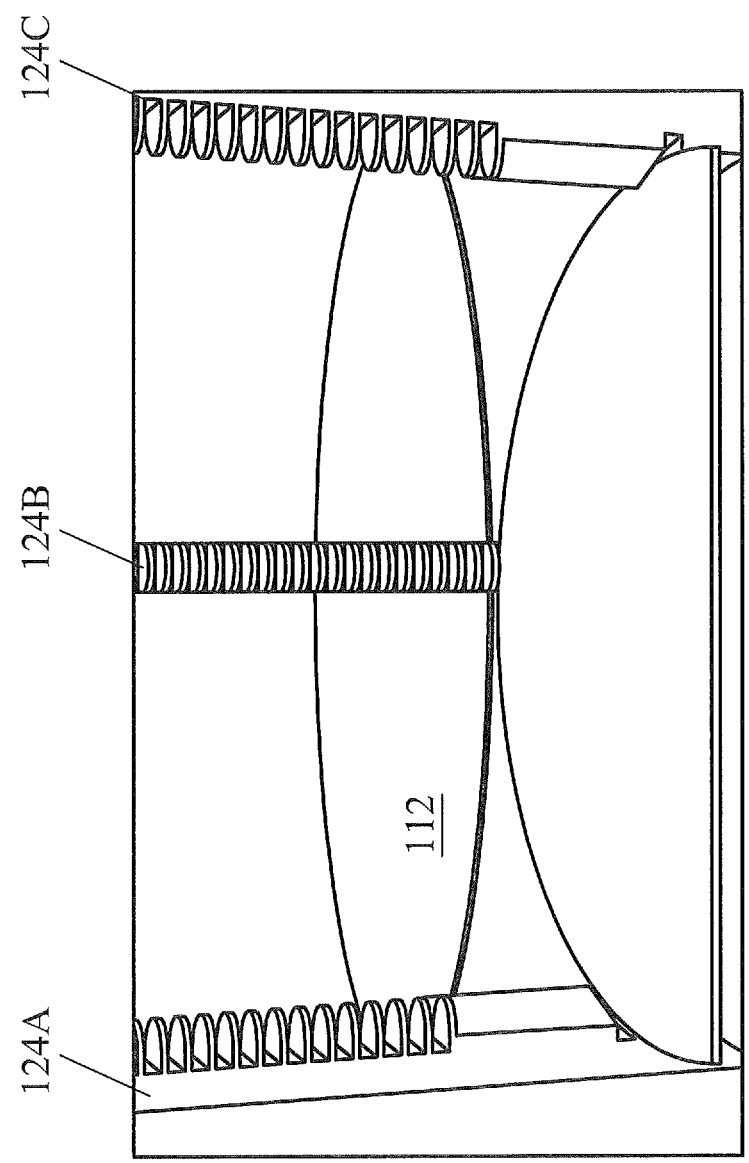
FIG. 4C is a perspective view of the rods, in accordance with some embodiments.

FIG. 4C is a perspective view of the rods 124A, 124B and 124C, in accordance with some embodiments. As noted above, each rod 124A, 124B and 124C of the rod set may include multiple fingers disposed in a vertically-stacked relationship to each other and separated respectively from each other by respective slots. Each of the slots may be configured to receive a bevel of a wafer 112 such that the vertical wafer vessel 110 may be configured to secure multiple wafers 112 in a vertically-stacked relationship. In various embodiments the three rods 124A, 124B and 124C may be utilized to secure each wafer in three locations at each of the rods 124A, 124B and 124C.

In various embodiments, the two rods 124A and 124C (also referred to as front rods) may differ from the rod 124B (also referred to as a back rod). For example, in certain embodiments, the two rods 124A and 124C may have a modulus of section (e.g., total volume of a rod with a finger) of about 200 mm$^3$ to about 300 mm$^3$ (e.g., of about 264 mm$^3$ in certain embodiments), a breakage force of about 20 kg to about 30 kg (e.g., of about 24 kg), a finger size (e.g., combined area of the end finger portion 218 and oblique finger portion 216) of about 70 mm$^2$ to about 80 mm$^2$ (e.g., of about 74 mm$^2$) and a wafer contact area (e.g., area of the finger configured to contact a wafer) of about 40 mm$^2$ to about 50 mm$^2$ (e.g., of about 46 mm$^2$). In particular embodiments, the rod 124B may have a modulus of section (e.g., total volume of a rod with a finger) of about 300 mm$^3$ to about 400 mm$^3$ (e.g., of about 315 mm$^3$ in certain embodiments), a breakage force of about 20 kg to about 30 kg (e.g., of about 28 kg), a finger size (e.g., combined area of the end finger portion 218 and oblique finger portion 216) of about 60 mm$^2$ to about 70 mm$^2$ (e.g., of about 61 mm$^2$) and a wafer contact area (e.g., area of the finger configured to contact a wafer) of about 20 mm$^2$ to about 30 mm$^2$ (e.g., of about 29 mm$^2$).

Figure 4D:
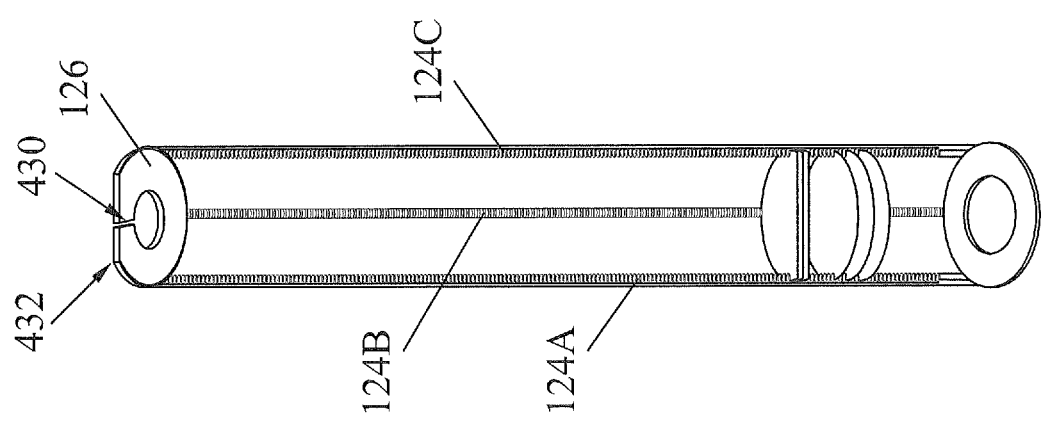
FIG. 4D is a perspective view of the vertical wafer vessel, in accordance with some embodiments.

FIG. 4D is a perspective view of the vertical wafer vessel 110, in accordance with some embodiments. As noted above, the vertical wafer vessel 110 may include a base 122 that defines an end of the vertical wafer vessel 110 from which the rods 124A, 124B and 124C extend. Also, the base may comprise an opening and be shaped in an annular fashion (e.g., with a central opening). This central opening may be utilized to reduce the amount of material in the base and allow for faster heating or cooling of the vertical wafer vessel 110. In various embodiments, the top base 126 may also define an end of the vertical wafer vessel 110 from which the rods 124A, 124B and 124C extend. In various embodiments, the top base 126 may include a slot 430 (e.g., to form a C shape) such that the top base 126 is not completely annular. This C shape may allow the top base 126 to more effectively expand and contract due to thermal expansion during operation of the semiconductor furnace that processes the wafers loaded onto the vertical wafer vessel 110. Furthermore, the top base 126 may include a flattened end 432 such that the top base 126 is not entirely circular. This flattened end may be utilized to allow the top base 126 to better fit within a particular semiconductor furnace.

Figure 5:
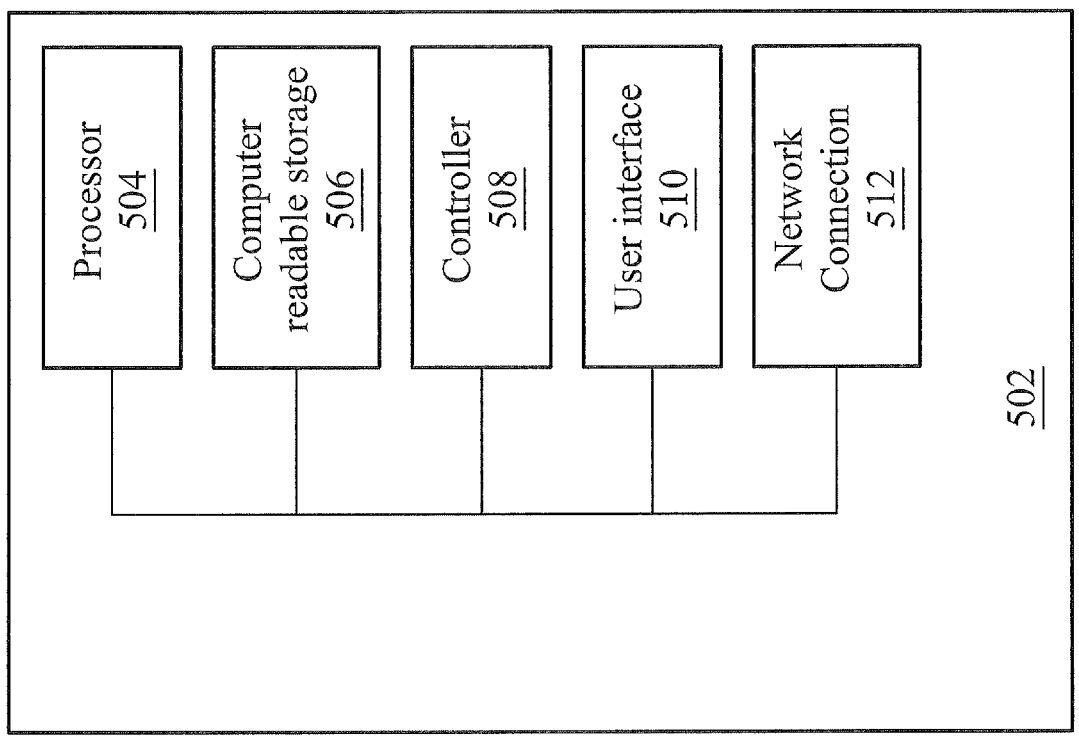
FIG. 5 is a block diagram of a semiconductor furnace functional module of a semiconductor furnace, in accordance with some embodiments.

FIG. 5 is a block diagram of a semiconductor furnace functional module of 502 a semiconductor furnace, in accordance with some embodiments. The semiconductor furnace functional module 502 may be part of a semiconductor furnace. The semiconductor furnace functional module may include a processor 504. In further embodiments, the processor 504 may be implemented as one or more processors.

The processor 504 may be operatively connected to a computer readable storage module 506 (e.g., a memory and/or data store), a controller module 508 (e.g., a controller), a user interface module 510 (e.g., a user interface), and a network connection module 512 (e.g., network interface). In some embodiments, the computer readable storage module 506 may include semiconductor furnace logic that may configure the processor 504 to perform various processes discussed herein. The computer readable storage may also store data, such as identifiers for a wafer, identifiers for a semiconductor furnace, identifiers for particular gas or plasma, and any other parameter or information that may be utilized to perform the various processes discussed herein.

The semiconductor furnace functional module 502 may include a controller module 508. The controller module 508 may be configured to control various physical apparatuses that control movement or functionality for a semiconductor furnace, vertical thermal reaction chamber, vertical wafer vessel, and the like. For example, the controller module 508 may be configured to control movement or functionality for at least one of a robotic arm that moves the vertical wafer vessel and/or individual wafer, an actuator for the semiconductor furnace or vertical thermal reaction chamber and the like. For example, the controller module 508 may control a motor or actuator that may move or activate at least one of a robotic arm, functionality of a semiconductor furnace, and/or functionality of a vertical thermal reaction chamber. The controller may be controlled by the processor and may carry out aspects of the various processes discussed herein.

The semiconductor furnace functional module 502 may also include the user interface module 510. The user interface module may include any type of interface for input and/or output to an operator of the semiconductor furnace functional module 502, including, but not limited to, a monitor, a laptop computer, a tablet, or a mobile device, etc.

The network connection module 512 may facilitate a network connection of the semiconductor furnace functional module 502 with various devices and/or components of the semiconductor furnace functional module 502 that may communicate (e.g., send signals, messages, instructions, or data) within or external to the semiconductor furnace functional module 502. In certain embodiments, the network connection module 512 may facilitate a physical connection, such as a line or a bus. In other embodiments, the network connection module 512 may facilitate a wireless connection, such as over a wireless local area network (WLAN) by using a transmitter, receiver, and/or transceiver. For example, the network connection module 512 may facilitate a wireless or wired connection with the processor 504, the computer readable storage 506, and the controller 508.

Figure 6:
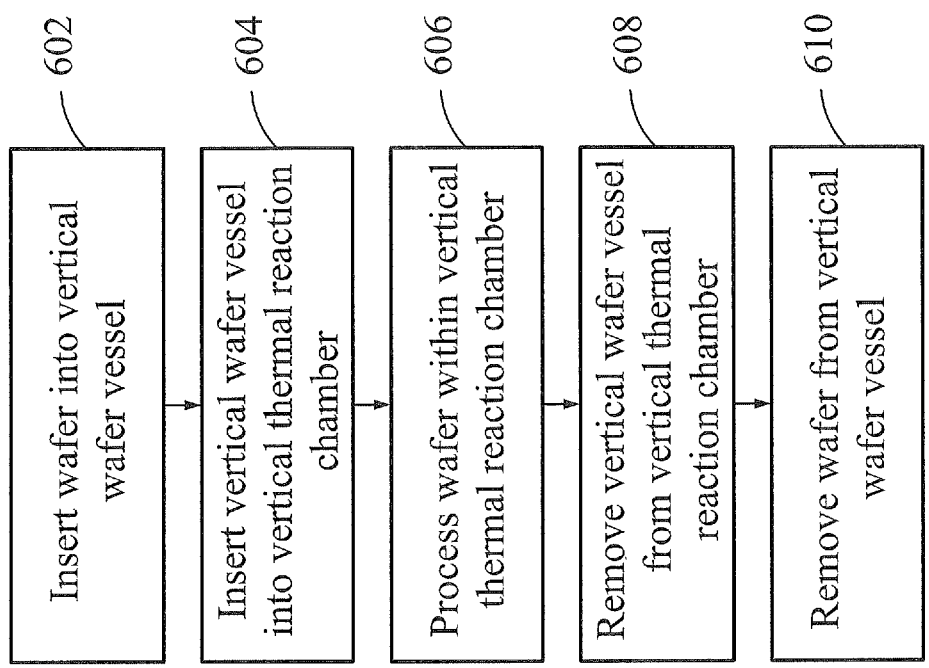
FIG. 6 is a flow chart of a semiconductor furnace process, in accordance with some embodiments.

FIG. 6 is a flow chart of a semiconductor furnace process 600, in accordance with some embodiments. The semiconductor furnace process 600, may be performed using components of a semiconductor furnace, as introduced above. It is noted that the process 600 is merely an example, and is not intended to limit the present disclosure. Accordingly, it is understood that additional operations may be provided before, during, and after the process 600 of FIG. 6, certain operations may be omitted, certain operations may be performed concurrently with other operations, and that some other operations may only be briefly described herein.

At operation 602, a wafer may be inserted into a vertical wafer vessel. The wafer may be part of a batch of wafers that may be inserted into the vertical wafer vessel to be secured in a vertically-stacked relationship to each other (e.g., be disposed in a stack and vertically displaced relative to each other). A vertical wafer vessel may be sized to hold any number of wafers, such as 50-125 wafers or more in some embodiments. However, any suitable number of wafers may be held by the vertical wafer vessel depending on the height of a reaction chamber in which the vertical wafer vessel is configured to be housed. In some embodiments, vertical spacing of wafers in a vertical wafer vessel may be about 6 mm to about 10 mm. In certain embodiments, the vertical wafer vessel may be made of quartz, SiC, or any other suitable material for thermal operations.

In various embodiments, the handling of wafers to and from the slots within the vertical wafer vessel may be performed by a robotic handler (e.g., a robot or a robotic arm). The robotic handler may handle wafer transfers by a single, planar, two-axis, random access, cassette-to-cassette motion. The robotic handler may be composed of suitable material for thermal operations including, but not limited to, a ceramic (e.g., quartz), a metal (e.g., stainless steel), an aluminum alloy, or aluminum oxide.

In various embodiments, a vertical wafer vessel may include a base that physically connects a rod set of multiple rods. Each rod of the rod set may include multiple fingers disposed in a vertically-stacked relationship to each other and separated respectively from each other by respective slots. Each of the slots may be configured to receive a bevel of a wafer such that the vertical wafer vessel may be configured to secure multiple vessels in a vertically-stacked relationship. Also, each of the multiple fingers may include a rounded end at a furthest extension (e.g., extension from the rest of the rod).

In various embodiments, each rod may include a rear rod portion that is farthest from the wafers that the vertical wafer vessel is configured to hold, a middle rod portion adjacent the rear rod portion, an oblique rod portion adjacent to the middle rod portion, an oblique finger portion, and an end finger portion that is closest to the wafers that the vertical wafer vessel is configured to hold. Accordingly, the end finger portion may be configured to contact the wafer. In various embodiments, the oblique finger portion may extend from the rounded end along a straight line. Also, the oblique rod portion may extend from the oblique finger portion along that same straight line. In various embodiments, the oblique finger portion may be bound within two straight lines (e.g., two lines) that are from about 80 degrees to about 40 degrees apart from each other, such as by being about 53 degrees apart from each other. In certain embodiments, the base may comprise an opening and be shaped in an annular fashion (e.g., with a central opening). Also, in various embodiments, the rod set may include three rods. Although certain embodiments may contemplate a rod set as including three rods, any number of rods may be included in a rod set as desired for different applications in various embodiments. For example, a rod set of a vertical wafer vessel may include two rods in certain embodiments, four rods in other embodiments, or five rods in yet further embodiments.

At operation 604, the vertical wafer vessel may be inserted into a vertical thermal reaction chamber. In certain embodiments, the vertical wafer, vessel may be placed on a vertical wafer vessel elevator or lift and robotically-controlled arm (e.g., robot or robotic arm) for positioning and raising the vertical wafer vessel into the thermal reaction chamber via an openable bottom portal of the vertical thermal reaction chamber. The openable bottom portal may include a lid which may be opened or closed to seal the openable bottom portal of the vertical thermal reaction chamber to form a gas-tight chamber seal for processing the wafers.

In various embodiments, the vertical wafer vessels may be disposed on an openable/closeable lid assembly which forms a bottom closure portal and platform for supporting the vertical wafer vessel. The lid assembly may be configured and adapted to temporarily attach to and seal the bottom portal of the reaction chamber to form a gas-tight temporary connection during processing. The lid assembly may be mounted on a vertical elevator or lift which is operable to raise the vertical wafer vessel into the reaction chamber.

As introduced above, the vertical thermal reaction chamber may have a cylindrical shape in one embodiment and may be made of quartz or SiC, The vertical thermal reaction chamber may have any suitable height or length depending on the number of wafers to be processed in each batch (e.g., the size of the vertical wafer vessel and/or the desired number of wafers to be processed in each batch or in one session of wafer processing). In some exemplary embodiments, the vertical thermal reaction chamber may have a representative vertical height or length of 100-150 cm. However, any suitable height or length may be provided. In some representative embodiments, the vertical thermal reaction chamber for processing 450 mm wafers may be sized to be more than 450 mm diameter and a chamber length of about 50 to 200 cm depending on the number of wafers to be processed simultaneously in the chamber.

At operation 606, the wafers within the vertical wafer vessel may be processed within the vertical thermal reaction chamber. The vertical thermal reaction chamber may be utilized in the context of semiconductor processing or fabrication steps such as oxidation, diffusion, doping, annealing, and CVD. These processes are typically performed at elevated temperatures within heated controlled environments. For example, CVD is a chemical vapor deposition process used to produce or deposit thin films of material on the wafer including without limitation metals, silicon dioxide, tungsten, silicon nitride, silicon oxynitride, and various dielectrics. The CVD process entails placing a wafer or plurality of wafers in a heated reaction chamber and introducing one or more reactant gases into the chamber. The gases contain with various chemical precursors (e.g. $SiH_2Cl_2$ and $NH_3$ or silane and $NH_3$ to form a silicon nitride film) that react at the heated wafer surface to form a thin film of the desired semiconductor material and thickness thereon. The uniformity of the film deposited on the wafer by CVD is affected and controlled by regulating and attempting to optimize CVD process parameters such as temperature of the wafer, reaction chamber pressure, flow path and rate of reactant gases, and deposition time or duration.

In various embodiments, the reaction chamber and associated assembly may include a gas manifold with gas inlets and gas outlets for introducing and removing CVD process reactant gases from the reaction chamber. In certain embodiments, a rotator (e.g., shaft or other rotating platform) may rotating the vertical wafer vessel and wafers held therein when the vertical wafer vessel is positioned in the reaction chamber may be provided to promote uniform gas flow and heating throughout the wafer stack.

At operation 608, the vertical wafer vessel may be removed from the vertical thermal reaction chamber. In certain embodiments, the vertical wafer vessel may on a vertical wafer vessel elevator or lift and robotically-controlled arm (e.g., robot or robotic arm) for positioning, and lowering the vertical wafer vessel from the thermal reaction chamber via the openable bottom portal of the vertical thermal reaction chamber. In various embodiments, the vertical wafer vessels may be disposed on the openable/closeable lid assembly which forms a bottom portal and platform for supporting the vertical wafer vessel. The lid assembly may be configured and adapted to temporarily detach and unseal seal the bottom portal of the reaction chamber to release the vertical wafer vessel. The lid assembly may be mounted on a vertical elevator or lift which is operable to lower the vertical wafer vessel from the reaction chamber.

At operation 610, the waver may be removed from the vertical waver vessel. In certain embodiments, the wafers may be removed from the vertical wafer vessel for further processing. In various embodiments, the handling of wafers to and from the slots within the vertical wafer vessel may be performed by the robotic handler (e.g., robot or robotic arm). The robotic handler may handle wafer transfers by a single, planar, two-axis, random access, cassette-to-cassette motion.

In an embodiment, a system includes: a base; and a rod set comprising multiple rods connected to the base, wherein each rod of the rod set comprises multiple fingers disposed in a vertically-stacked relationship to each other and separated respectively from each other by respective slots, wherein each slot is configured to receive a bevel of a wafer, and wherein each of the multiple fingers comprises a rounded end at a furthest extension.

In another embodiment, a vertical wafer vessel includes: a base; and a rod set comprising multiple rods connected to the base, wherein each rod of the rod set comprises: multiple fingers disposed in a vertically-stacked relationship to each other and separated respectively from each other by respective slots, wherein each slot is configured to receive a wafer, wherein each of the multiple fingers comprises a rounded end at a furthest extension, and wherein each rod comprises a rear rod portion that is farthest from the wafer, a middle rod portion adjacent the rear rod portion, an oblique rod portion adjacent to the middle rod portion, an oblique finger portion, and an end finger portion that comprises the multiple fingers.

In another embodiment, a method includes: inserting a wafer into a vertical wafer vessel, wherein the vertical wafer vessel comprises: a base; and a rod set comprising multiple rods connected to the base, wherein each rod of the rod set comprises multiple fingers disposed in a vertically-stacked relationship to each other and separated respectively from each other by respective slots, wherein each slot is configured to receive a wafer bevel, and wherein each of the multiple fingers comprises a rounded end at a furthest extension; inserting the vertical wafer vessel into a vertical thermal reaction chamber; and heating the vertical wafer vessel within the vertical thermal reaction chamber.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
   a top base having an opening therein, wherein the top base includes a slot to form a C-shape such that the top base is not completely annular;
   a bottom base; and
   a rod set comprising multiple rods connected to the bottom base, wherein each rod of the rod set comprises multiple fingers disposed in a vertically-stacked relationship to each other and separated respectively from each other by respective slots.

2. The system of claim 1, wherein each rod comprises a rear rod portion that is farthest from the wafer, a middle rod portion adjacent the rear rod portion, an oblique rod portion adjacent to the middle rod portion, an oblique finger portion, and an end finger portion that comprises the multiple fingers.

3. The system of claim 2, wherein each slot is configured to receive a bevel of a wafer, and wherein each of the multiple fingers comprises a rounded end at a furthest extension, and the end finger portion is configured to contact the wafer.

4. The system of claim 2, wherein the oblique finger portion extends from the rounded end along a straight line.

5. The system of claim 4, wherein the oblique rod portion extends from the oblique finger portion along the straight line.

6. The system of claim 2, wherein the oblique finger portion defines two oblique lines that are from about 80 degrees to about 40 degrees apart from each other.

7. The system of claim 2, wherein the oblique finger portion defines two oblique lines that are 53 degrees apart from each other.

8. The system of claim 1, further comprising a vertical thermal reaction chamber in which the rod set is configured to be disposed.

9. A vertical wafer vessel comprising:
   a top base having an opening therein, wherein the top base includes a slot to form a C-shape such that the top base is not completely annular;
   a bottom base; and
   a rod set comprising multiple rods connected to the bottom base, wherein each rod of the rod set comprises:
   multiple fingers disposed in a vertically-stacked relationship to each other and separated respectively from each other by respective slots, wherein each slot is configured to receive a wafer, wherein each rod comprises a rear rod portion that is farthest from the wafer, a middle rod portion adjacent the rear rod portion, an oblique rod portion adjacent to the middle rod portion, an oblique finger portion, and an end finger portion that comprises the multiple fingers.

10. The vertical wafer vessel of claim 9, wherein each of the multiple fingers comprises a rounded end at a furthest extension, and the bottom base also comprises an opening.

11. The vertical wafer vessel of claim 9, wherein the rod set comprises three rods.

12. The vertical wafer vessel of claim 9, wherein the rear rod portion extends from the middle rod portion along two oblique lines that are from about 80 degrees to about 40 degrees apart from each other.

13. The vertical wafer vessel of claim 9, wherein the rear rod portion, the middle rod portion, the oblique rod portion, the oblique finger portion, and the end finger portion extend along a central axis, and wherein the end finger portion is shorter along the central axis than the oblique finger portion.

14. The vertical wafer vessel of claim 9, wherein the rear rod portion, the middle rod portion, the oblique rod portion, the oblique finger portion, and the end finger portion extend along a central axis, and wherein the rear rod portion is shorter along the central axis than the oblique finger portion.

15. A method, comprising:
    inserting a wafer into a vertical wafer vessel, wherein the vertical wafer vessel comprises:
    a top base having an opening therein, wherein the top base includes a slot to form a C-shape such that the top base is not completely annular;
    a bottom base; and
    a rod set comprising multiple rods connected to the bottom base, wherein each rod of the rod set comprises multiple fingers disposed in a vertically-stacked relationship to each other;
    inserting the vertical wafer vessel into a vertical thermal reaction chamber; and
    heating the vertical wafer vessel within the vertical thermal reaction chamber.

16. The method of claim 15, further comprising inserting the vertical wafer vessel into the vertical thermal reaction chamber via a vertical motion through a bottom portal of the vertical thermal reaction chamber.

17. The method of claim 15, further comprising:
    flowing a reactant gas horizontally over a face of the wafer.

18. The method of claim 15, further comprising:
    pumping a reactant gas into the vertical thermal reaction chamber while heating the vertical wafer vessel.

19. The method of claim 15, wherein each rod comprises a rear rod portion that is farthest from the wafer, a middle rod portion adjacent the rear rod portion, an oblique rod portion adjacent to the middle rod portion, an oblique finger portion, and an end finger portion that comprises the multiple fingers.

20. The method of claim 19, wherein the oblique finger portion defines two oblique lines that are from about 80 degrees to about 40 degrees apart from each other.

\* \* \* \* \*